(12) United States Patent
Hsieh et al.

(10) Patent No.: US 11,798,858 B2
(45) Date of Patent: Oct. 24, 2023

(54) SEMICONDUCTOR PACKAGE STRUCTURE INCLUDING REINFORCEMENT COMPONENT AND METHOD FOR MANUFACTURING THE SAME

(71) Applicant: Advanced Semiconductor Engineering, Inc., Kaohsiung (TW)

(72) Inventors: Meng-Wei Hsieh, Kaohsiung (TW); Hsiu-Chi Liu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/377,169

(22) Filed: Jul. 15, 2021

(65) Prior Publication Data

US 2023/0017013 A1  Jan. 19, 2023

(51) Int. Cl.
| H01L 23/552 | (2006.01) |
| H01L 23/31 | (2006.01) |
| H01L 21/56 | (2006.01) |
| H01L 23/00 | (2006.01) |

(52) U.S. Cl.
CPC .............. *H01L 23/31* (2013.01); *H01L 21/56* (2013.01); *H01L 23/552* (2013.01); *H01L 23/562* (2013.01)

(58) Field of Classification Search
CPC ....... H01L 23/31; H01L 21/56; H01L 23/552; H01L 23/562

USPC ........................................................ 257/659
See application file for complete search history.

(56) References Cited

U.S. PATENT DOCUMENTS

| 9,006,030 B1* | 4/2015 | Kwon ................. H01L 23/3128 438/126 |
| 10,276,551 B2 | 4/2019 | Lin et al. |
| 2009/0152688 A1* | 6/2009 | Do ......................... H01L 23/552 257/659 |
| 2009/0186446 A1* | 7/2009 | Kwon ..................... H01L 23/10 438/107 |
| 2010/0193240 A1* | 8/2010 | Takayama ........... H01L 23/3121 174/521 |
| 2011/0254156 A1* | 10/2011 | Lin ...................... H01L 21/6835 257/737 |
| 2015/0380334 A1* | 12/2015 | Hu ....................... H01L 21/6835 257/773 |
| 2016/0276309 A1* | 9/2016 | Paek .................... H01L 25/0652 |
| 2019/0252363 A1* | 8/2019 | Lin ........................ H01L 25/50 |
| 2020/0194362 A1 | 6/2020 | Park et al. |
| 2021/0249322 A1* | 8/2021 | Lin ......................... H01L 24/32 |

* cited by examiner

*Primary Examiner* — Didarul A Mazumder
(74) *Attorney, Agent, or Firm* — FOLEY & LARDNER LLP

(57) ABSTRACT

A semiconductor package structure and a method of manufacturing the same are provided. The semiconductor package structure includes a first electronic component, a second electronic component, and a reinforcement component. The reinforcement component is disposed above the first electronic component and the second electronic component. The reinforcement component is configured to reduce warpage.

16 Claims, 21 Drawing Sheets

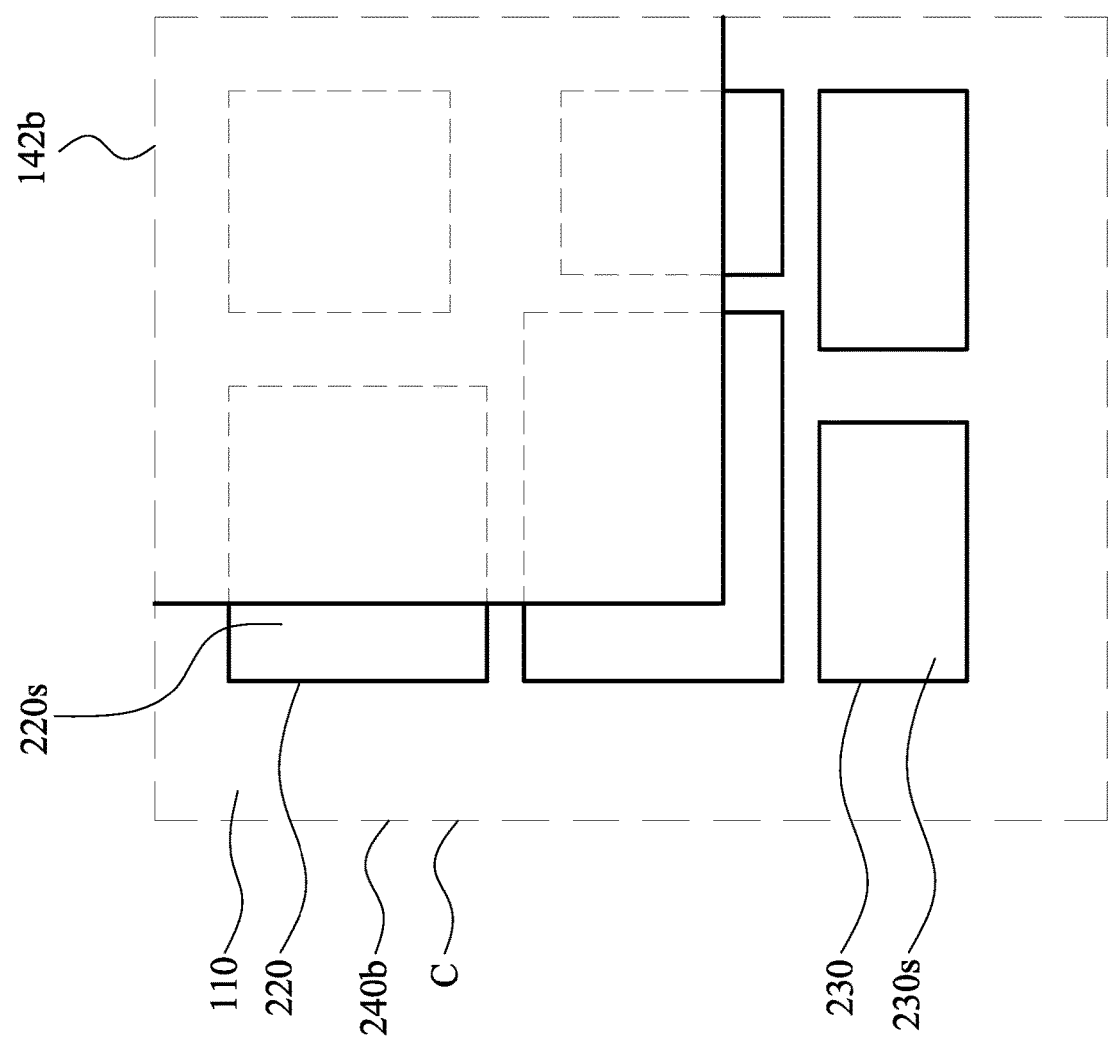

SEMICONDUCTOR PACKAGE STRUCTURE INCLUDING REINFORCEMENT COMPONENT AND METHOD FOR MANUFACTURING THE SAME

BACKGROUND

1. Field of the Disclosure

The present disclosure relates to a semiconductor package structure, and particularly to a semiconductor package structure with electronic components.

2. Description of the Related Art

As electronic components become smaller, package bodies (e.g., encapsulants) can occupy more volume in the semiconductor package structure, resulting in warpage. Further, when integrating different electronic components, spaces between the electronic components may also experience warpage, reducing yield. Therefore, a new semiconductor package structure is required to ameliorate the shortcomings described.

SUMMARY

In some embodiments, a semiconductor package structure includes a first electronic component, a second electronic component, and a reinforcement component. The reinforcement component is disposed above the first electronic component and the second electronic component. The reinforcement component is configured to reduce warpage.

In some embodiments, a semiconductor package structure includes a substrate, a first electronic component, a second electronic component, and a buffer layer. The substrate includes a surface. The first electronic component is disposed on the surface and has a top surface. The second electronic component is disposed on the surface and has a top surface. The buffer layer is configured to compensate a difference of elevations between the top surface of the first electronic component and the top surface of the second electronic component with respect to the surface of the substrate and to provide a planar surface non-coplanar with the top surface of the first electronic component and the top surface of the second electronic component.

In some embodiments, a method for manufacturing a semiconductor package structure includes: providing a semiconductor substrate including a plurality of unit portions, each of the plurality of unit portions includes a plurality of electronic components disposed thereon; and disposing a reinforcement component on at least one of the plurality of unit portions, wherein the reinforcement component covers at least one of the plurality of electronic components.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 9, FIG. 10, FIG. 11, FIG. 11A, FIG. 11B, FIG. 11C, FIG. 11D, FIG. 11E, FIG. 12, FIG. 13, and FIG. 14 illustrate various stages of an example of a method for manufacturing a semiconductor package structure according to some embodiments of the present disclosure.

DETAILED DESCRIPTION

Figure 1:
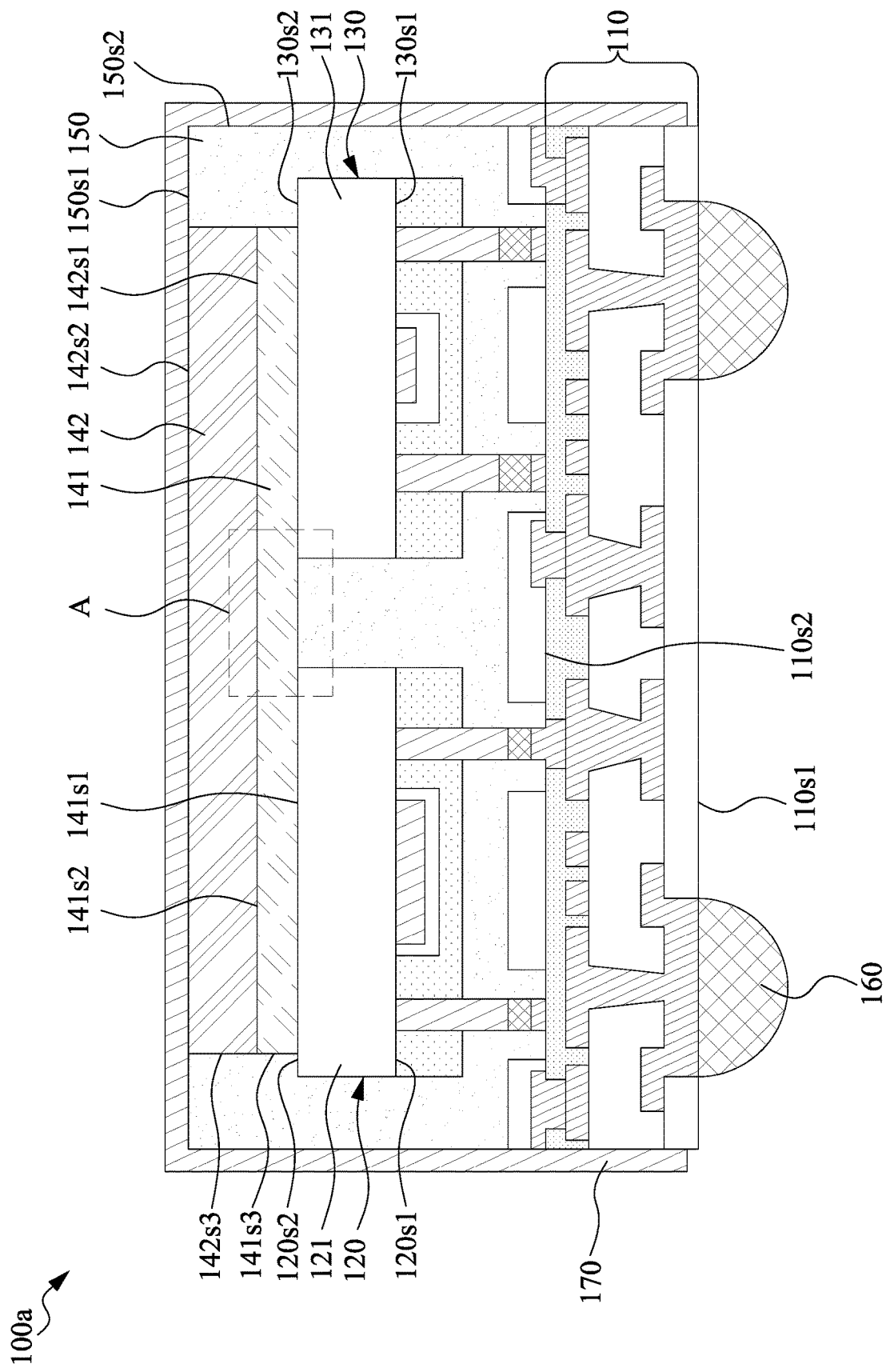
FIG. 1 is a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of an example of a semiconductor package structure 100a according to some embodiments of the present disclosure.

In some embodiments, the semiconductor package structure 100a may include a carrier 110, an electronic component 120, an electronic component 130, a buffer layer 141, a reinforcement component 142, an encapsulant 150, conductive terminals 160, and a shielding layer 170.

The carrier 110 may include a semiconductor substrate, which includes silicon or germanium in single crystal, polycrystalline, or amorphous form. The carrier 110 may include a redistribution layer (RDL) or traces for electrical connection between components. The carrier 110 can be replaced by other suitable carriers, such as a glass carrier, a lead frame, a printed circuit board, or other suitable carriers. The carrier 110 may have a surface 110s1 and a surface 110s2 opposite to the surface 110s1.

In some embodiments, the electronic component 120 may be disposed on the surface 110s2 of the carrier 110. The electronic component 120 may include active components and/or passive components. The active component may include a semiconductor die or a chip, such as a logic die (e.g., application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or other active components. In some embodiments, the electronic component 120 may include a plurality of transistors, diodes, or other active components. The transistor may include a bipolar junction transistor, MOSFET, JFET, or other transistors. The diode may include a Zener diode, photodiode, Schottky diode, or other diodes. The passive component may include a capacitor, inductor, resistor, filter, diplexer, balun, or a combination of such components. The electronic component 120 may have a surface 120s1 and a surface 120s2 opposite to the surface 120s1. The surface 120s1 of the electronic component 120 may face the surface 110s2 of the carrier 110. The surface 120s1 may also be referred to as an active surface or a lower surface, and the surface 120s2 may also be referred to as a back side surface or a top surface.

The electronic component 120 may include a substrate 121. The substrate 121 may be a semiconductor substrate. The substrate 121 may include silicon or germanium in single crystal, polycrystalline, or amorphous form.

In some embodiments, the semiconductor package structure 100a may include a molded underfill (MUF) structure. For example, a portion of the encapsulant 150 may be disposed between the electronic component 120 and the substrate 110.

In some embodiments, the electronic component 130 may be disposed on the surface 110s2 of the carrier 110. In some embodiments, the electronic component 130 may be physically spaced apart from the electronic component 120. The electronic component 130 may laterally overlap the electronic component 120. In some embodiments, the electronic component 120 and the electronic component 130 may define a gap extending between them. The electronic component 130 may include active components and/or passive components. The electronic component 130 may have a surface 130s1 and a surface 130s2 opposite to the surface 130s1. The surface 130s1 of the electronic component 130 may face the surface 110s2 of the carrier 110. The surface 130s1 may also be referred to as an active surface or a lower surface, and the surface 130s2 may also be referred to as a backside surface or a top surface.

The electronic component 130 may include a substrate 131. The substrate 131 may be a semiconductor substrate. The substrate 131 may include silicon or germanium in single crystal, polycrystalline, or amorphous form.

In some embodiments, the buffer layer 141 may be disposed on the electronic component 120. In some embodiments, the buffer layer 141 may be in contact with the surface 120s2 of the electronic component 120. In some embodiments, the buffer layer 141 may be disposed on the electronic component 130. In some embodiments, the buffer layer 141 may be in contact with the surface 130s2 of the electronic component 130. In some embodiments, the buffer layer 141 is configured to compensate a difference between the surface 120s1 of the electronic component 120 and surface 130s1 of the electronic component 130. The buffer layer 141 may include or be made of a flexible, flowable material or optically cured material. The buffer layer 141 may also serve as an adhesive for connecting the electronic component 120 and the reinforcement component 142 as well as the electronic component 130 and the reinforcement component 142. The buffer layer 141 may include, for example, an optical cured adhesive, a die attach film or other suitable adhesives. The buffer layer 141 may include a surface 141s1, a surface 141s2 opposite to the surface 141s1, and a surface 141s3 extending between the surface 141s1 and the surface 141s2. The surface 141s1 may face the electronic component 120 and the electronic component 130. In some embodiments, a portion of the surface 120s2 of the electronic component 120 may be exposed by the buffer layer 141. In some embodiments, a portion of the surface 130s2 of the electronic component 130 may be exposed by the buffer layer 141.

In some embodiments, the reinforcement component 142 may be disposed on the buffer layer 141. The reinforcement component 142 may be disposed on the surface 120s2 of the electronic component 120 and the surface 130s2 of the electronic component 130. In some embodiments, the reinforcing component 142 may be configured to eliminate relative shift, along a vertical axis, between the electronic component 120 and the electronic component 130. The relative shift may manifest as, a height difference between the surface 120s2 of the electronic component 120 and the surface 130s2 of the electronic component 130. In some embodiments, the reinforcement component 142 may be configured to reduce the warpage of the semiconductor package structure 100a. In some embodiments, the reinforcement component 142 may have a rigidity greater than that of the encapsulant 150. In some embodiments, a stiffness of the reinforcement component 142 is different from that of the encapsulant 150. In some embodiments, a stiffness of the reinforcement component 142 is greater than that of the encapsulant 150. The reinforcement component 142 may include silicon, glass, ceramic or other suitable materials. In some embodiments, the reinforcement component 142 may include a semiconductor die. In some embodiments, the reinforcement component 142 may include a dummy die without active components and/or passive components formed thereon. The reinforcement component 142 may include a surface 142s1, a surface 142s2 opposite to the surface 142s1, and a surface 142s3 extending between the surface 142s1 and the surface 142s2. The surface 142s1 may face the electronic component 120 and the electronic component 130. In some embodiments, the surface 141s3 of the buffer layer 141 may be substantially coplanar with the surface 142s3 of the reinforcement component 142. In some embodiments, a portion of the surface 120s2 of the electronic component 120 may be exposed by the reinforcement component 142. In some embodiments, a portion of the surface 130s2 of the electronic component 130 may be exposed by the reinforcement component 142.

The encapsulant 150 may be disposed on the surface 110s2 of the carrier 110. The encapsulant 150 may encapsulate the electronic component 120 and the electronic component 130. In some embodiments, the encapsulant 150 may encapsulate the buffer layer 141. In some embodiments, the encapsulant 150 may encapsulate the reinforcement component 142. The encapsulant 150 may include, a Novolac-based resin, an epoxy-based resin, a silicone-based resin, or another suitable material. Suitable fillers may also be included, such as powdered $SiO_2$. The encapsulant 150 may have a surface 150s1 and a surface 150s2 adjacent to the surface 150s1. In some embodiments, the surface 150s1 may be substantially coplanar with the surface 142s2 of the reinforcement component 142. The encapsulant 150 may have a first volume. The sum of the electronic component 120, the electronic component 130, and the reinforcement component 142 may have a second volume. In some embodiments, the second volume may be greater than or substantially equal to the first volume. In some embodiments, a ratio between the first volume and the second volume ranges from about 3:7 to about 1:1. The second volume may be defined as the sum of the substrate 121, the substrate 131 and the reinforcement component 142. When the second volume exceeds or substantially equals the first volume, warpage may be reduced, thereby preventing the semiconductor package structure 100a from breaking during manufacture.

The conductive terminals 160 may be disposed on the surface 110s1 of the carrier 110. The conductive terminal 160 may be configured to electrically connect the electronic component 120 and/or electronic component 130 to other electronic components (not shown). In some embodiments, the conductive terminal 160 may include solder balls (e.g., Sn ball).

The shielding layer 170 may cover the surface 150s1 and the surface 150s2 of the encapsulant 150. In some embodiments, the shielding layer 170 may be in contact with the surface 142s2 of the reinforcement component 142. The shielding layer 170 may extend below the surface 110s2 of the carrier 110. The shielding layer 170 may electrically connect to the conductive traces of the carrier 110. The shielding layer 170 may include electrically conductive material, such as copper, tin, aluminum, gold, silver, tungsten, nickel, or other suitable material.

Figure 2:
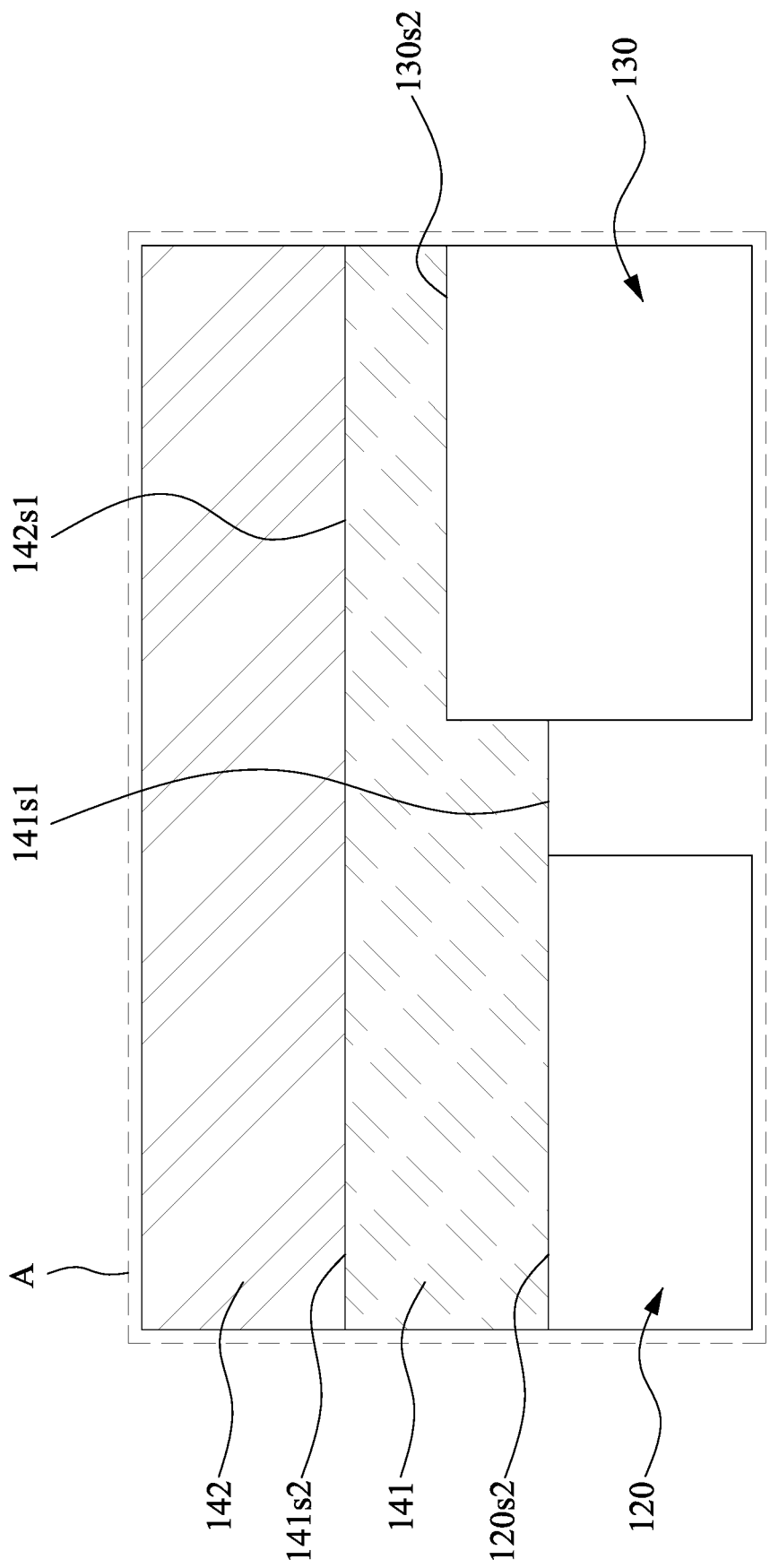
FIG. 2 is an enlarged view of region A of the semiconductor package structure as shown in FIG. 1.

FIG. 2 is an enlarged view of region A of the semiconductor package structure 100a as shown in FIG. 1.

As shown in FIG. 2, the surface 120s2 of the electronic component 120 and the surface 130s2 of the electronic component 130 may have different elevations with respect to the reinforcement component 142. The buffer layer 141 may compensate the height difference between the surface 120s2 of the electronic component 120 and the surface 130s2 of the electronic component 130. That is, the surface 141s2 of the buffer layer 141 may be substantially planar. In some embodiments, the buffer layer 141 may have an uneven thickness. For example, the buffer layer 141 may have a greater thickness over the surface 120s2 of the electronic component 120, and have a less thickness over the surface 130s2 of the electronic component 130. In some embodiments, the surface 141s2 of the buffer layer 141 may be smoother than the surface 141s1 of the buffer layer 141. For example, the vertical distance between the surface 141s2 of the buffer layer 141 and the surface 142s2 of the reinforcement component 142 may have a relatively small deviation, and the vertical distance between the surface 141s1 of the buffer layer 141 and the surface 142s2 of the reinforcement component 142 may have a relatively great deviation. In some embodiments, the surface 141s1 may have a step due to different elevations between the surface 120s2 of the electronic component 120 and the surface 130s2 of the electronic component 130.

In this embodiment, the reinforcement component 142 may reduce the warpage of the semiconductor package structure 100a because the reinforcement component 142 has a stiffness greater than that of the encapsulant 150. The reinforcement component 142 may eliminate the shift between the surface 120s2 of the electronic component 120 and the surface 130s2 of the electronic component 130 caused by warpage. That is, the difference of the elevations between the surface 120s2 of the electronic component 120 and the surface 130s2 of the electronic component 130 may be reduced by the reinforcement component 142. Further, since the buffer layer 141 may provide a substantial planar surface (e.g., surface 141s2) on which the reinforcement component 142 can be disposed, warpage of the entire structure may be further decreased.

In another example, a semiconductor package structure may have no reinforcement components. As such, the ratio between the encapsulant and the electronic components may be about 2:1, generating relatively pronounced warpage. The embodiments of the disclosure, however, can result in warpage of the semiconductor package structure 100a falling to 25%, which can improve yield.

Figure 3:
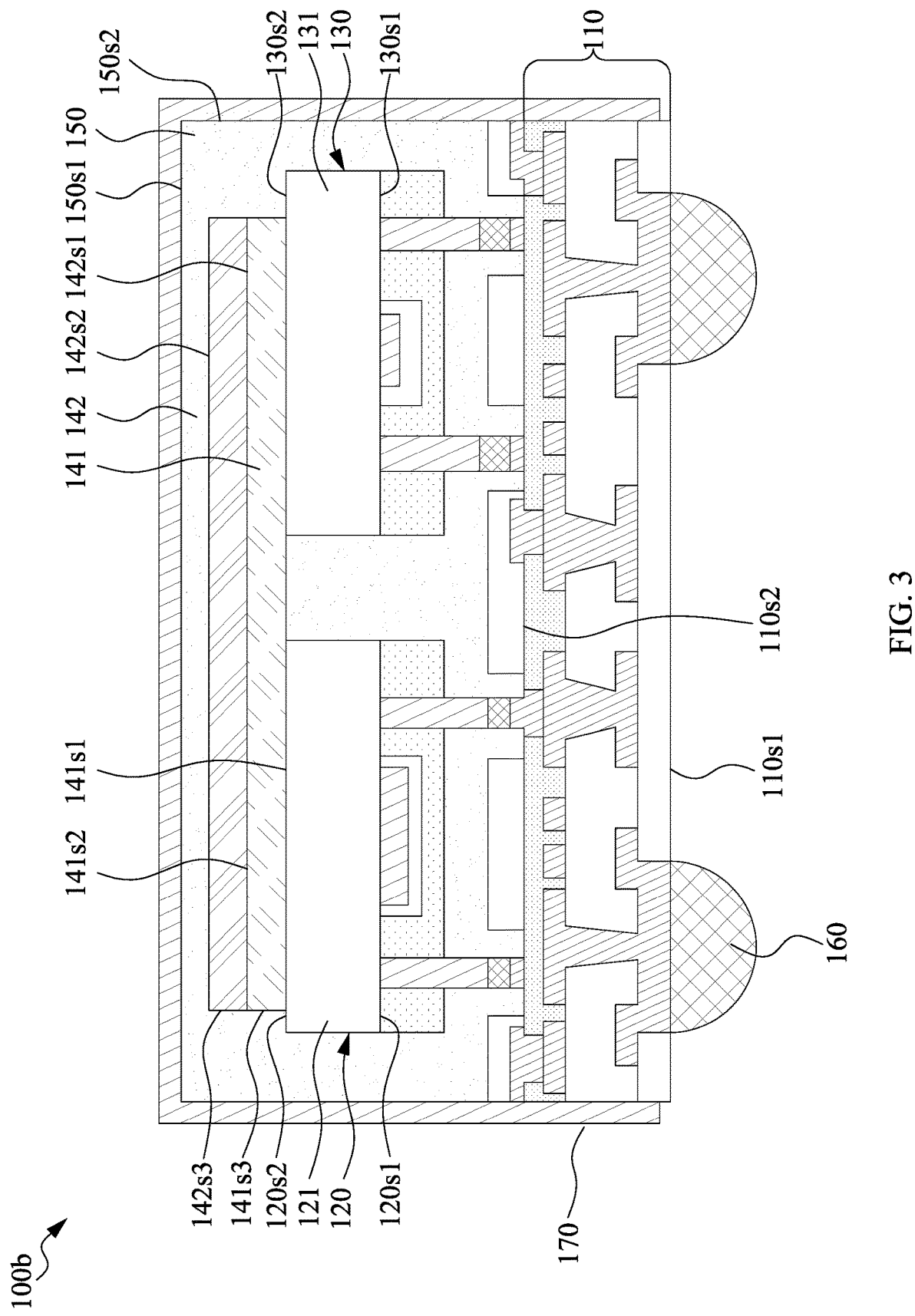
FIG. 3 is a cross-sectional view of an example of a semiconductor package structure according to some embodiments of the present disclosure.

FIG. 3 is a cross-sectional view of an example of a semiconductor package structure 100b according to some embodiments of the present disclosure. The semiconductor package structure 100b of FIG. 3 may have a structure similar to that of the semiconductor package structure 100a of FIG. 1 other than the encapsulant 150 of the semiconductor package structure 100b which may cover the reinforcement component 142.

In some embodiments, the surface 150s1 of the encapsulant 150 may be not coplanar with the surface 142s2 of the reinforcement component 142. The surface 142s2 may be covered by the encapsulant 150. The shielding layer 170 may be spaced apart from the reinforcement component 142. In this embodiment, the reinforcement component 142 may reduce the warpage of the semiconductor package structure 100b.

Figure 4:
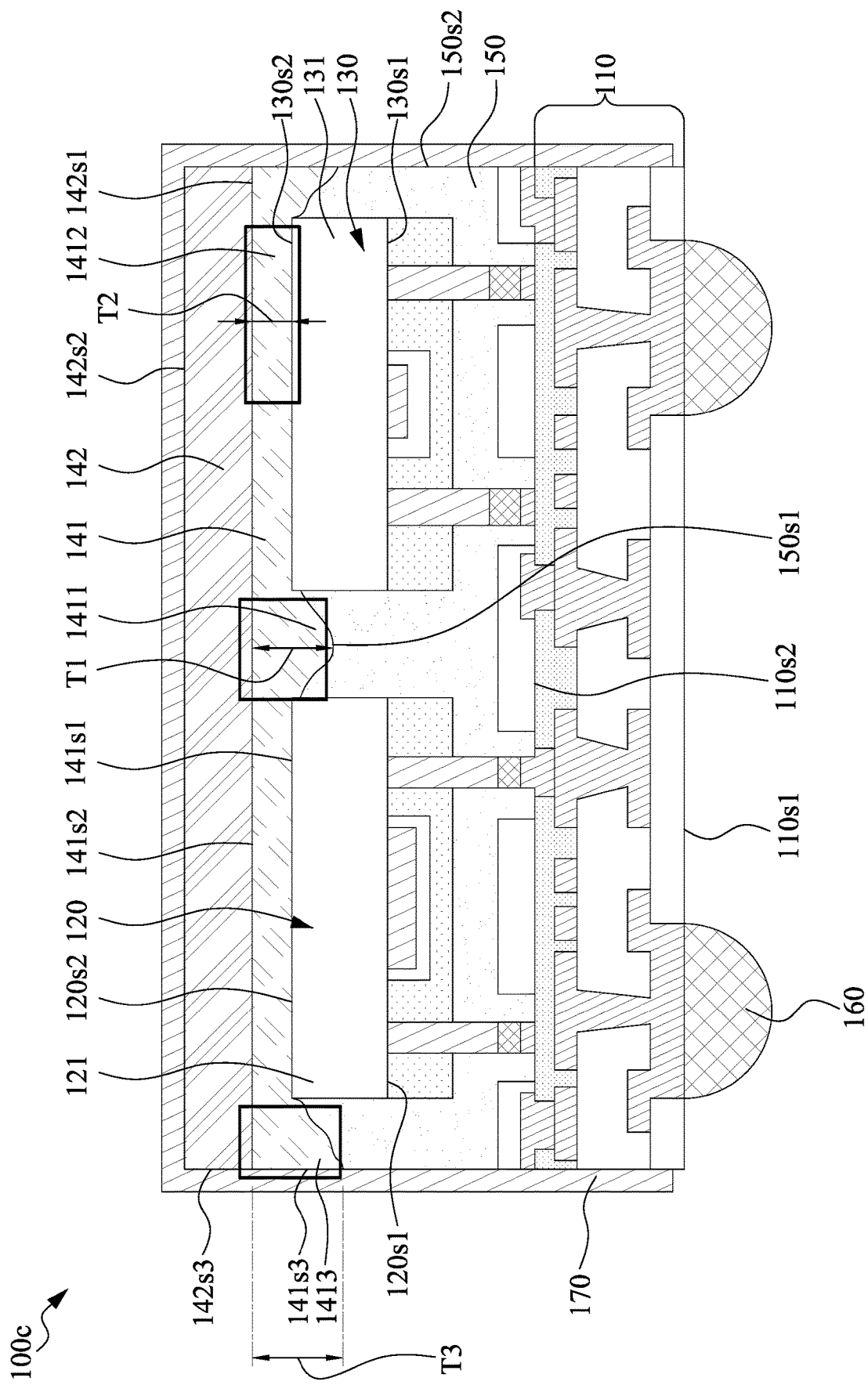
FIG. 4 is a cross-sectional view of an example of a semiconductor package structure according to some embodiments of the present disclosure.

FIG. 4 is a cross-sectional view of an example of a semiconductor package structure 100c according to some embodiments of the present disclosure. The semiconductor package structure 100c of FIG. 4 may have a structure similar to that of the semiconductor package structure 100a of FIG. 1 other than a portion of the buffer layer 141 of the semiconductor package structure 100c may be disposed within the gap defined by the electronic component 120 and the electronic component 130.

In some embodiments, the buffer layer 141 may have portions 1411, 1412, and 1413. The portion 1411 may be disposed with the gap defined by the electronic component 120 and the electronic component 130 and extend between the electronic component 120 and the electronic component 130. The portion 1412 may be disposed over the electronic component 120 or the electronic component 130. The portion 1413 may be disposed on a side of the electronic component 120 facing away from electronic component 130. In some embodiments, the portions 1411, 1412 and 1413 of the buffer layer 141 may have different thicknesses. In some embodiments, a thickness T1 of the portion 1411 of the buffer layer 141 may be greater than a thickness T2 of the portion 1412 of the buffer layer 141. In some embodiments, a thickness T3 of the portion 1413 of the buffer layer 141 may be greater than the thickness T2 of the portion 1412 of the buffer layer 141. In some embodiments, the thickness T3 of the portion 1413 of the buffer layer 141 may be greater than a thickness T1 of the portion 1411 of the buffer layer 141. In some embodiments, the portion 1413 of the buffer layer 141 may be in contact with the shielding layer 170. In this embodiment, the reinforcement component 142 may reduce the warpage of the semiconductor package structure 100c.

In some embodiments, the buffer layer 141 may be configured to separate the electronic component 120 or 130 from being in contact with the shielding layer 170. In some embodiments, the buffer layer 141 may be configured to make a predetermined distance between the electronic component 120 (or 130) and the shielding layer 170. Therefore, the semiconductor package structure 100c may avoid electrical coupling between the electronic component 120 (or 130) and the shielding layer 170 such that the characteristic of the electronic component 120 or 130, for example, the characteristic serving as a wave filter, may not be influenced. In some embodiments, the reinforcement component 142 may be configured to separate the electronic component 120 or 130 from being in contact with the shielding layer 170. In some embodiments, the reinforcement component 142 may be configured to make a predetermined distance between the electronic component 120 (or 130) and the shielding layer 170. Therefore, the semiconductor package structure 100c may avoid electrical coupling between the electronic component 120 (or 130) and the shielding layer 170 such that the characteristic of the electronic component 120 or 130, for example, the characteristic serving as a wave filter, may not be influenced.

Figure 5:
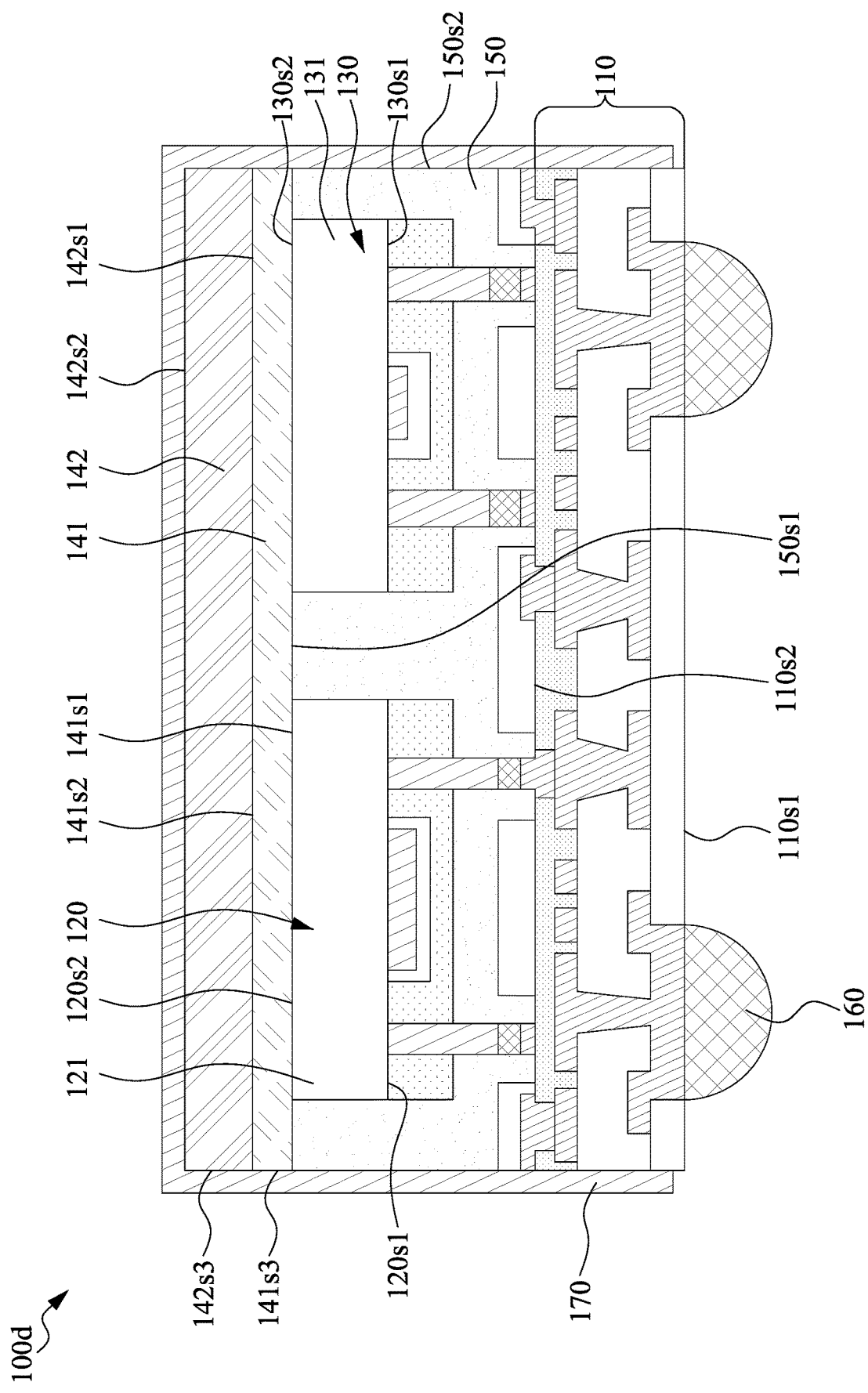
FIG. 5 is a cross-sectional view of an example of a semiconductor package structure according to some embodiments of the present disclosure.

FIG. 5 is a cross-sectional view of an example of a semiconductor package structure 100d according to some embodiments of the present disclosure. The semiconductor package structure 100d of FIG. 5 may have a structure similar to that of the semiconductor package structure 100a of FIG. 1 other than the reinforcement component 142 of the semiconductor package structure 100d may fully cover the electronic component 120 and the electronic component 130.

In some embodiments, the surface 120s2 of the electronic component 120 may be fully covered by the reinforcement component 142. In some embodiments, the surface 130s2 of the electronic component 130 may be fully covered by the reinforcement component 142. In some embodiments, the surface 142s2 of the reinforcement component 142 may be in contact with the shielding layer 170. In some embodiments, the surface 142s3 of the reinforcement component 142 may be in contact with the shielding layer 170. In some embodiments, the surface 150s1 of the encapsulant 150 may be coplanar with the surface 140s1 of the buffer layer 140. In this embodiment, the reinforcement component 142 may have a greater volume and further reduce warpage of the semiconductor package structure 100c.

Figure 6:
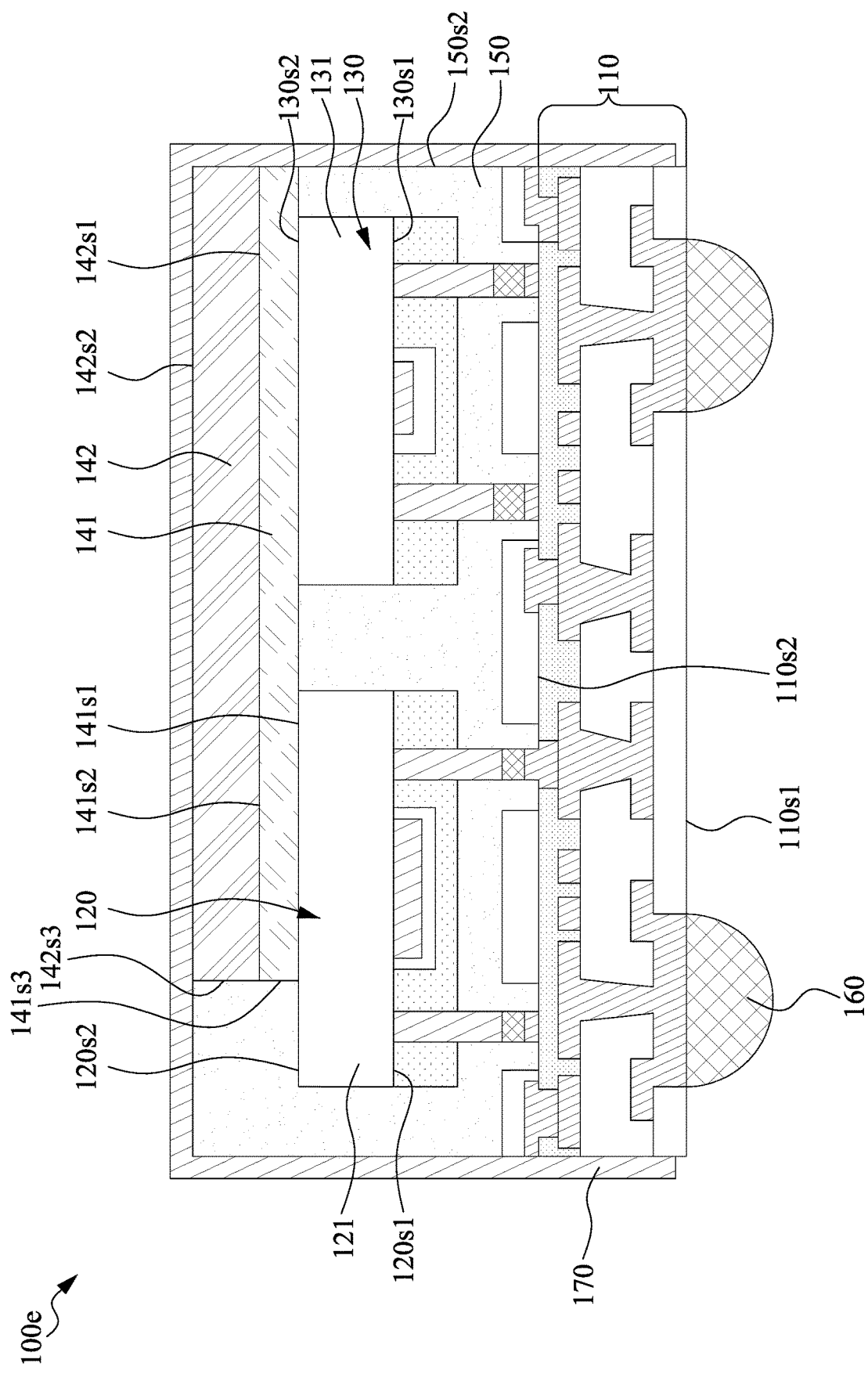
FIG. 6 is a cross-sectional view of an example of a semiconductor package structure according to some embodiments of the present disclosure.

FIG. 6 is a cross-sectional view of an example of a semiconductor package structure 100e according to some embodiments of the present disclosure. The semiconductor package structure 100e of FIG. 6 may have a structure similar to that of the semiconductor package structure 100a of FIG. 1 other than the electronic component 130 may be fully covered by the reinforcement component 142.

In some embodiments, one of the electronic component 120 and the electronic component 130 may be fully covered by the reinforcement component 142, while the other one of the electronic component 120 and the electronic component 130 may have a portion exposed by the reinforcement component 142. In some embodiments, one side of the surface 142s3 of the reinforcement component 142 may be in contact with the encapsulant 150, while the other one is physically spaced apart from the encapsulant 150.

Figure 7:
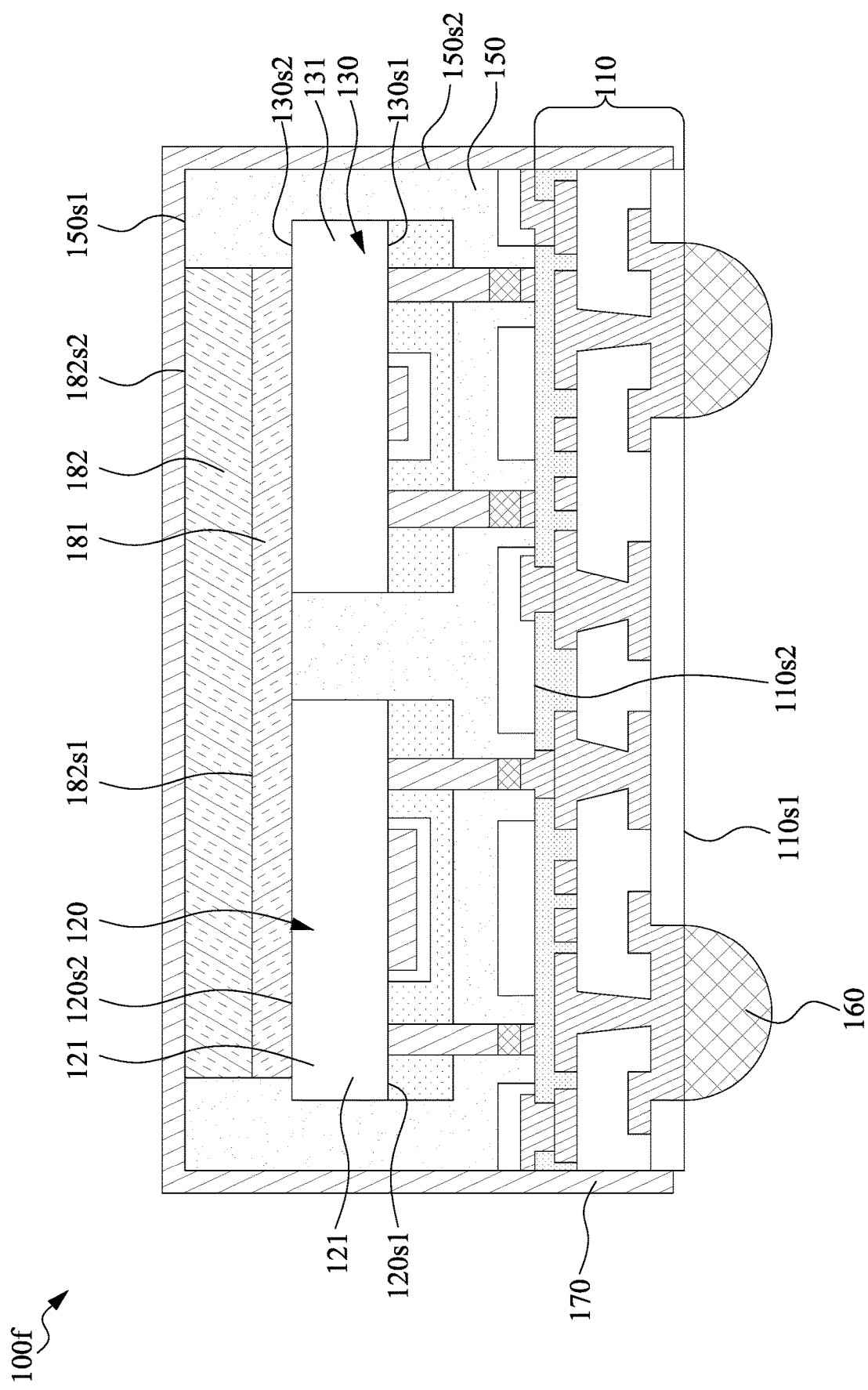
FIG. 7 is a cross-sectional view of an example of a semiconductor package structure according to some embodiments of the present disclosure.

FIG. 7 is a cross-sectional view of an example of a semiconductor package structure 100f according to some embodiments of the present disclosure. The semiconductor package structure 100f of FIG. 7 may have a structure similar to that of the semiconductor package structure 100a of FIG. 1 other than the semiconductor package structure 100f may have a layer 181 and a heat sink 182 replacing the buffer layer 141 and the reinforcement component 142, respectively.

In some embodiments, the layer 181 may include a thermally conductive adhesive, such as thermal interface material. In some embodiments, the heat sink 182 may include metal or metal alloy, such as copper, tin, aluminum, gold, silver, tungsten, nickel or other suitable materials. In some embodiments, the heat sink 182 may have a surface 182s1 and a surface 182s2 opposite to the surface 182s1. The surface 182s1 may face the electronic component 120. In some embodiments, the surface 182s2 of the heat sink 182 may be substantially coplanar with the surface 150s1 of the encapsulant 150. In some embodiments, the heat sink 182 may have a stiffness greater than that of the encapsulant 150. In this embodiment, heat may be dissipated through the heat sink 182, and the performance of the semiconductor package structure 100f may be improved. Further, the heat sink 182 may reduce the warpage of the semiconductor package structure 100f.

Figure 8:
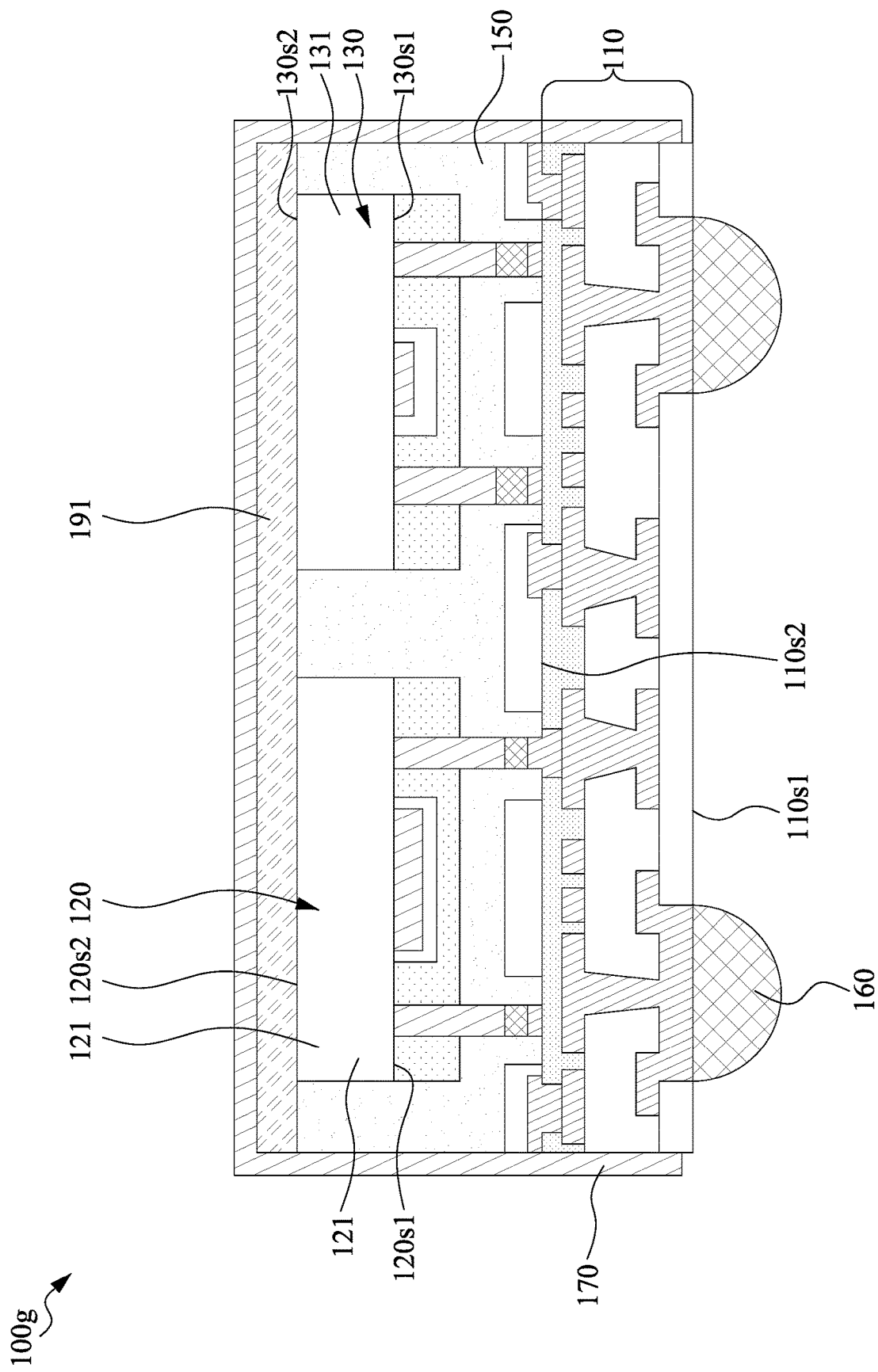
FIG. 8 is a cross-sectional view of an example of a semiconductor package structure according to some embodiments of the present disclosure.

FIG. 8 is a cross-sectional view of an example of a semiconductor package structure 100g according to some embodiments of the present disclosure. The semiconductor package structure 100g of FIG. 8 may have a structure similar to that of the semiconductor package structure 100a of FIG. 1 other than the semiconductor package structure 100g may include a backside film 191 replacing the buffer layer 141 and the reinforcement component 142. In some embodiments, the backside film 191 may include an adhesive, a release film or other suitable materials.

FIG. 9, FIG. 10, FIG. 11, FIG. 11A, FIG. 11B, FIG. 11C, FIG. 11D, FIG. 11E, FIG. 12, FIG. 13, and FIG. 14 illustrate various stages of an example of a method for manufacturing a semiconductor package structure according to some embodiments of the present disclosure.

Figure 9:
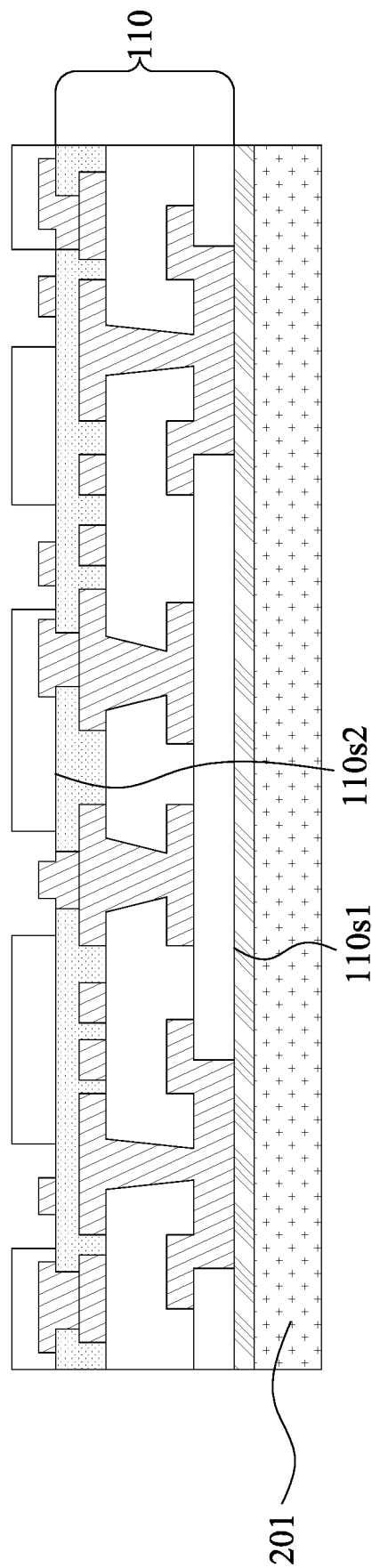

Referring to FIG. 9, a supporter 201 may be provided. A carrier 110 may be disposed on the supporter 201. The supporter 201 may be configured to support the carrier 110 and elements formed on the carrier 110. The supporter 201 may include, for example, a glass carrier or other suitable carriers. The surface 110s1 of the carrier 110 may be in contact with the supporter 201. In some embodiments, the carrier 110 may include a wafer and a redistribution structure formed in the carrier 110.

Figure 10:
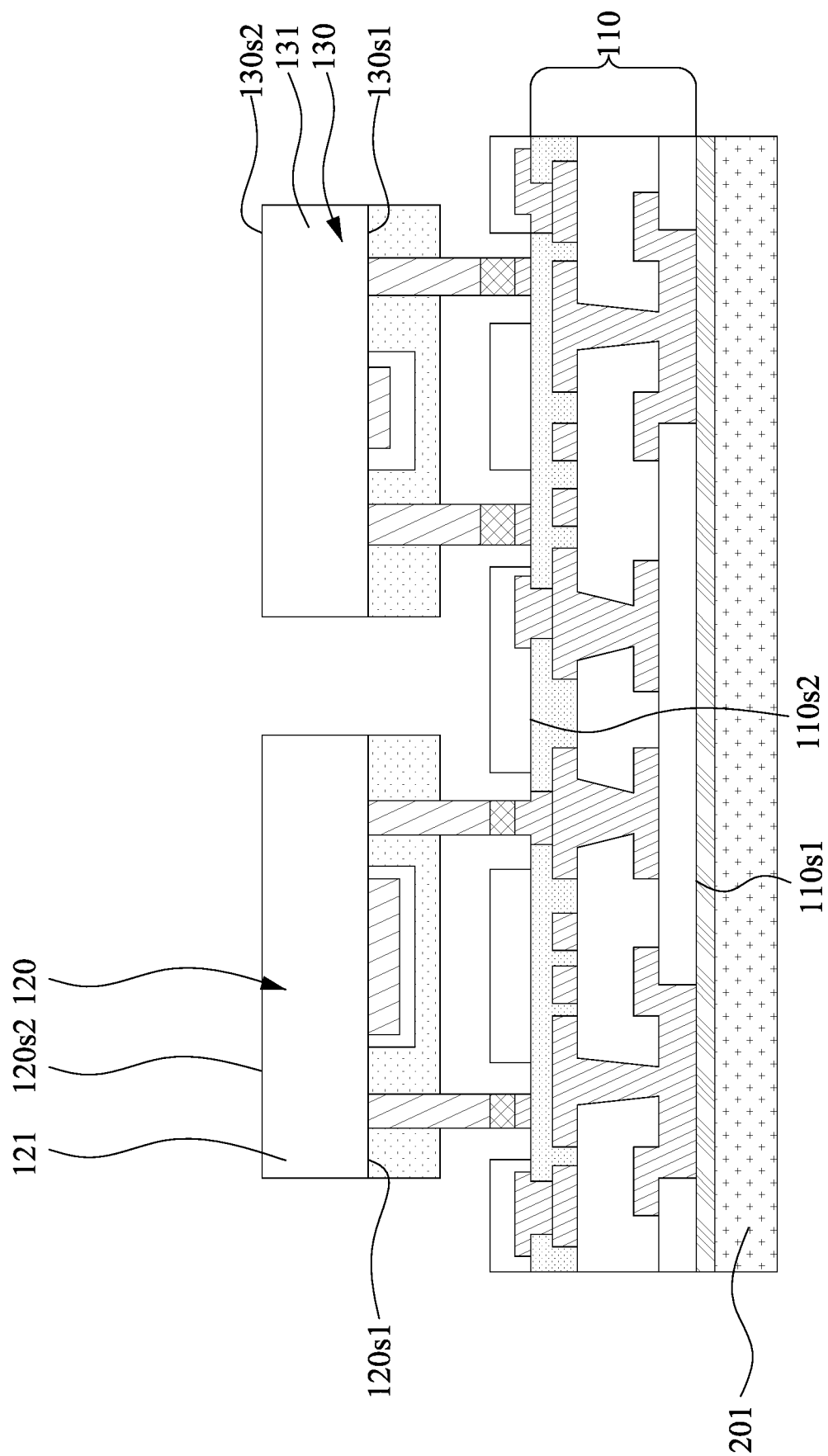

Referring to FIG. 10, electronic components 120 and 130 may be disposed on the carrier 110. In some embodiments, the electronic components 120 and 130 may be bonded to the carrier 110 by a flip-chip operation or other suitable operations. The electronic component 120 may have a surface 120s1 facing the carrier 110 and a surface 120s2 opposite to the surface 120s1. The electronic component 130 may have a surface 130s1 facing the carrier 110 and a surface 130s2 opposite to the surface 130s1. In some embodiments, the electronic components 120 and 130 may be in form of a wafer or a strip.

Figure 11:
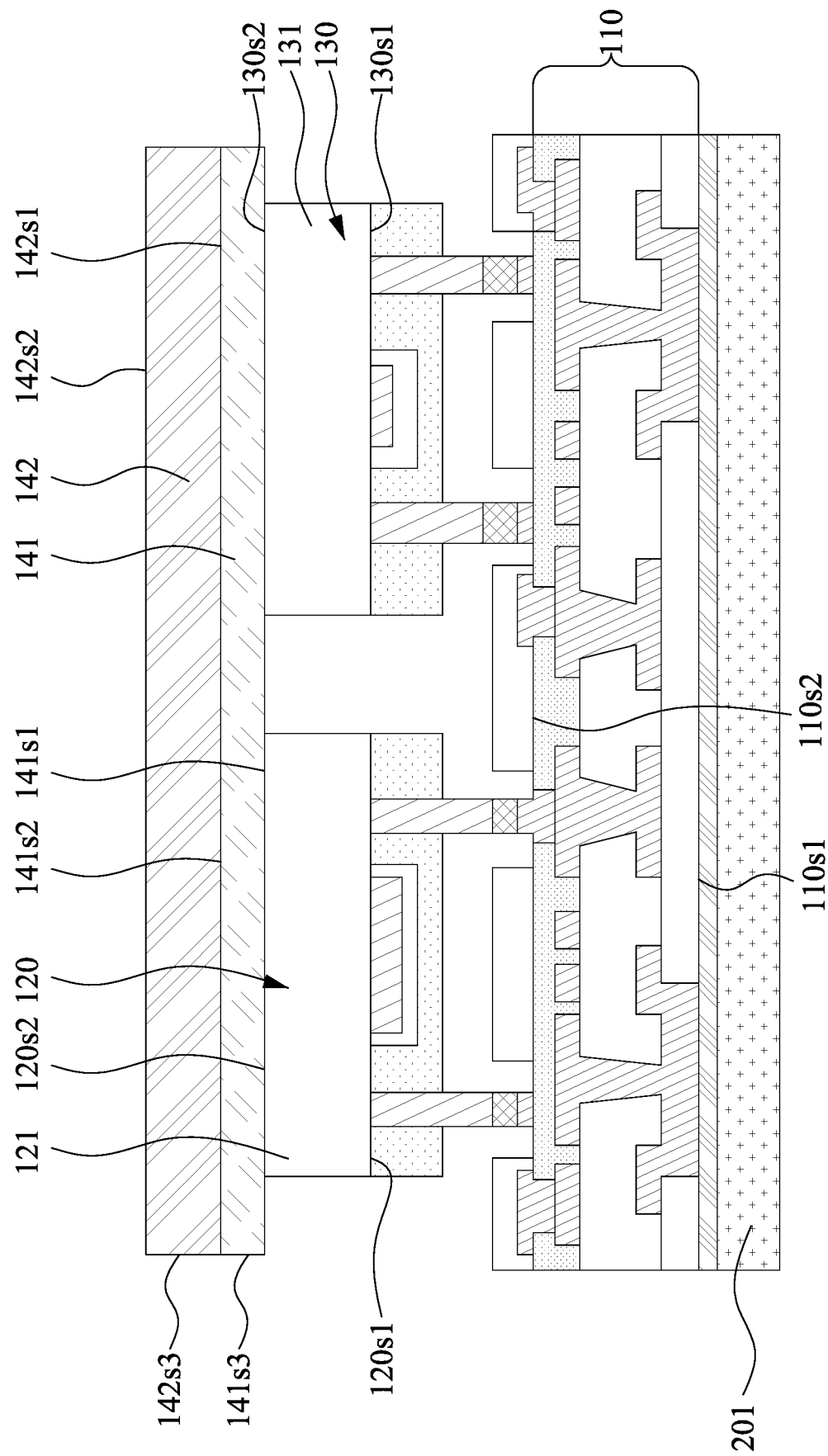

Referring to FIG. 11, a buffer layer 141 and a reinforcement component 142 may be formed on the surface 120s2 of the electronic component 120 and the surface 130s2 of the electronic component 130. The buffer layer 141 may be configured to compensate a difference between the surface 120s2 of the electronic component 120 and the surface 130s2 of the electronic component 130 as shown in FIG. 2. The reinforcement component 142 may be configured to increase the rigidity of the whole structure.

Figure 11A:
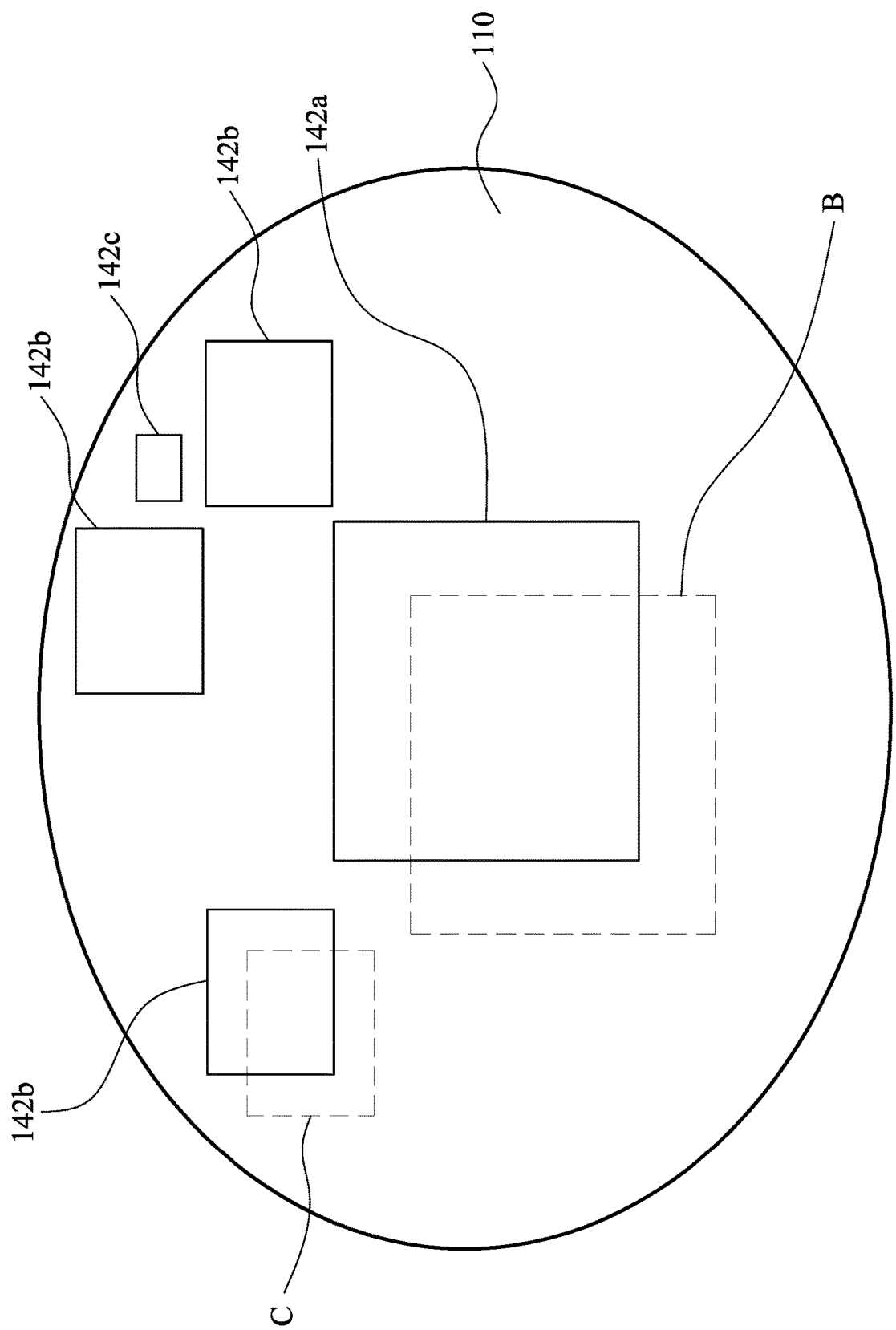
Figure 11B:
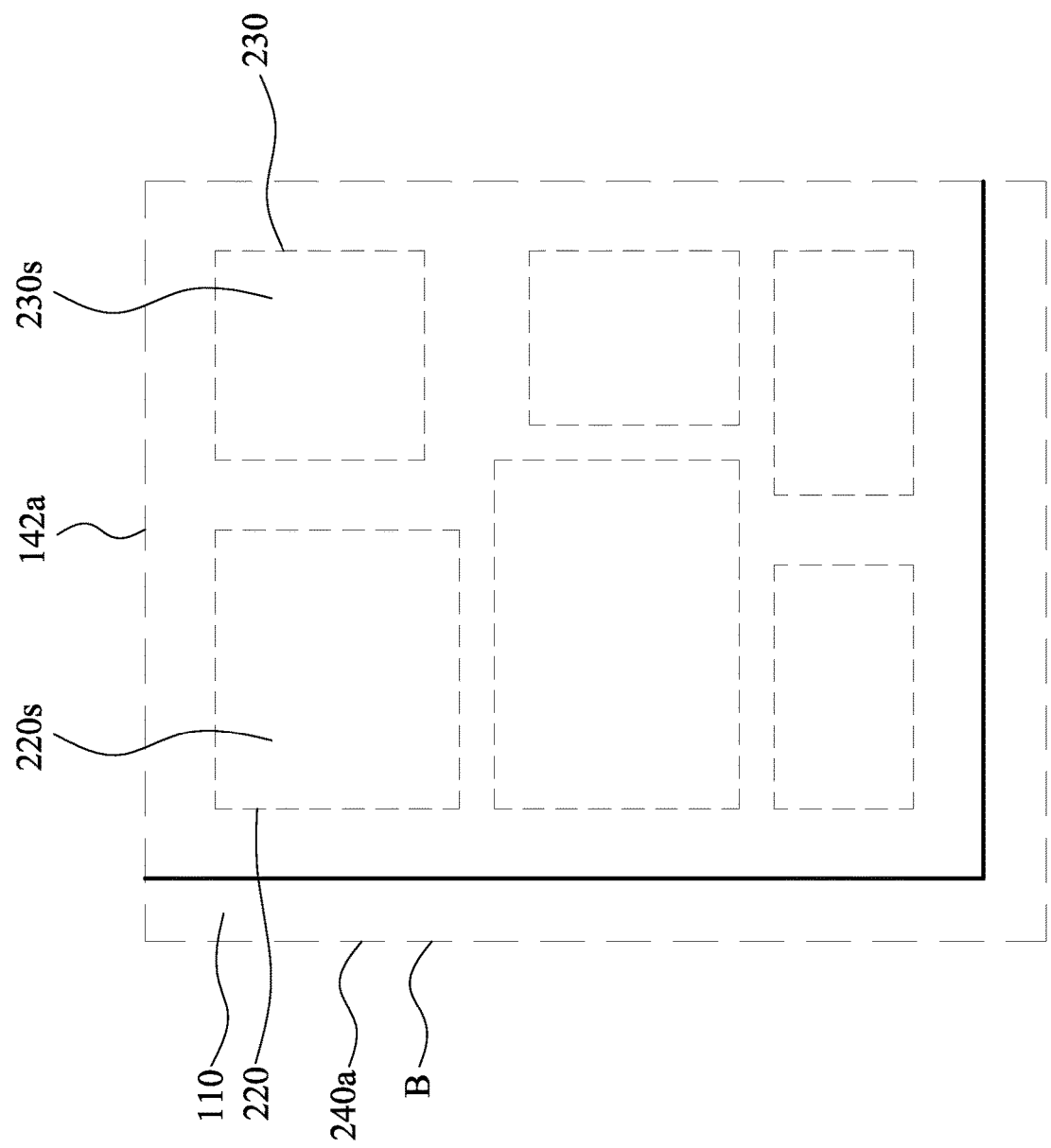

Referring to FIG. 11A, FIG. 11B, and FIG. 11C, wherein FIG. 11A illustrates a top view in the stage of FIGS. 11, and 11B and FIG. 11C are partial enlarged views of regions B and C of FIG. 11A, respectively. As shown in FIG. 11A, a plurality of reinforcement components 142, such as reinforcement components 142a, 142b and 142c, are formed on the carrier 110. The reinforcement components 142a, 142b and 142c may have different sizes. For example, the top surface area of the top surface of the reinforcement component 142a may be different from that of the reinforcement component 142b. In some embodiment, the reinforcement component (e.g., the reinforcement component 142b or 142c), which is closer to an edge of the substrate 110, may have a top surface area less than that of the reinforcement component (e.g., the reinforcement component 142a) which is closer to the center of the substrate 110. Since the substrate 110 have a circle profile, when a greater reinforcement component (e.g., the reinforcement component 142a) is disposed on the substrate 110, a smaller reinforcement component (e.g., the reinforcement component 142b or 142c) may be used to cover the rest region of the substrate 110. As a result, warpage due to shrinkage of an encapsulant, which is formed on subsequent stage, may be reduced.

As shown in FIG. 11B and FIG. 11C, a plurality of semiconductor package units (or unit portions) 240a and 240b, represented with a dotted line, are disposed on the carrier 110. Each of the semiconductor package units 240a and 240b may correspond to one semiconductor package structure, such as the semiconductor package structure 100a-100g after the semiconductor package units 240a and 204b are singulated. Each of the semiconductor package units 240a and 240b may include a plurality of electronic components, such as electronic components 220 and 230. The electronic components 220 and 230 may be the same as or similar to the electronic component 120. As shown in FIG. 11B, each of the top surfaces of the electronic components, such as the surface 220s of the electronic component 220 and the surface 230s of the electronic component 230, are fully covered by the reinforcement component 142a. As shown in FIG. 11C, some of the electronic components are partially exposed by the reinforcement component 142b. For example, a portion of the surface 220s of the electronic component 220 is exposed by the reinforcement component 142b.

As shown in FIG. 11C, some of the electronic components are free from covering of the reinforcement component 142b. For example, the surface 230s of the electronic component 230 can be exposed from the reinforcement component 142b. In some embodiments, a projection of the electronic component (such as the electronic component 230 in FIG. 11C) on the substrate 110 may be separated from a projection of the reinforcement component 142b on the substrate 110. In some embodiments, before forming an encapsulant, a portion of the electronic components (e.g., the electronic component 230) may be free from covering of a reinforcement component 142. Since the reinforcement components 142 may reduce the warpage of the entire structure, including the entire substrate 110 and elements thereon, shown in FIG. 11A, some of the electronic components may be fully exposed from the reinforcement components 142, or some of the semiconductor package units may be fully exposed from the reinforcement components 142.

Figure 11D:
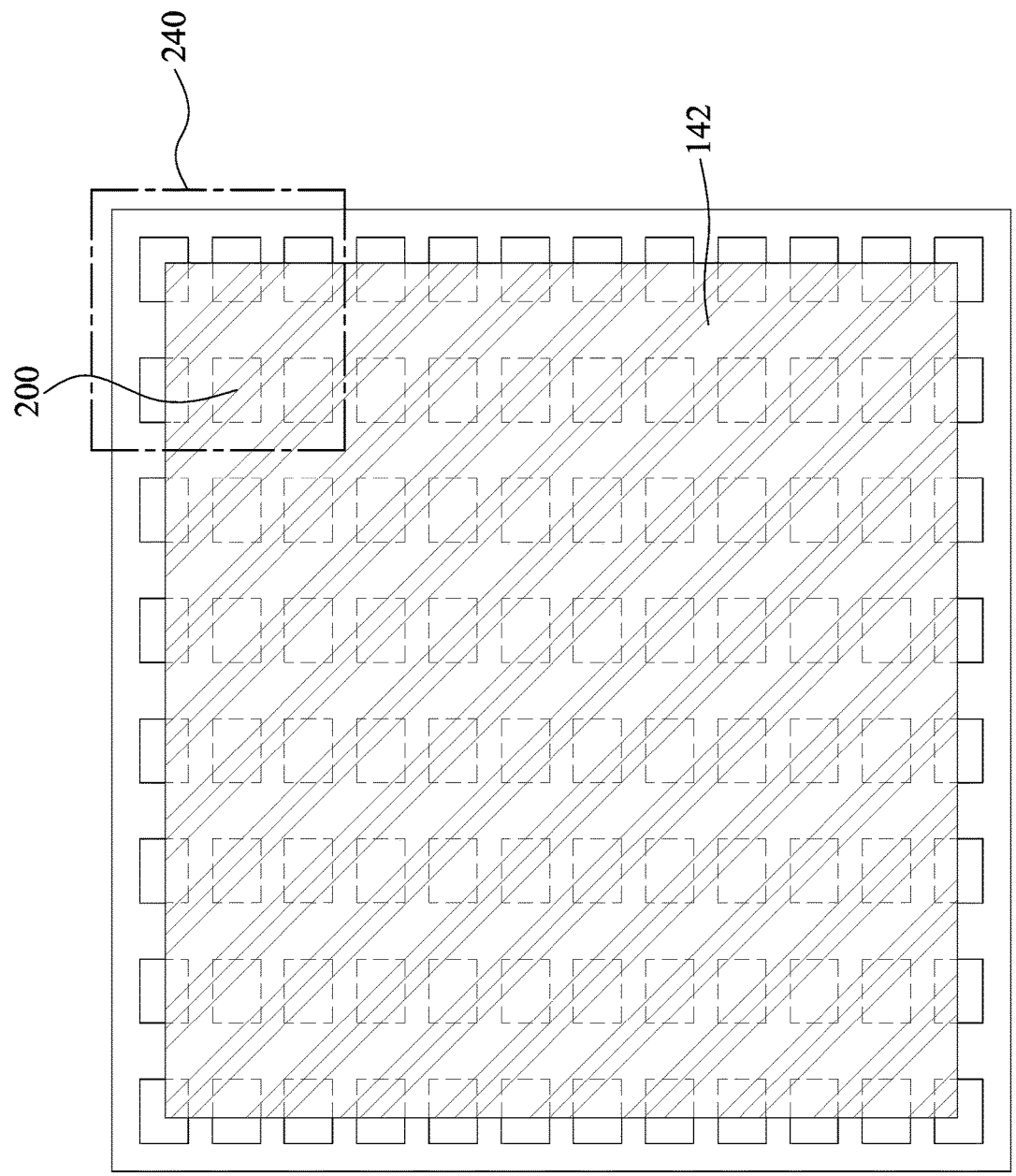
Figure 11E:
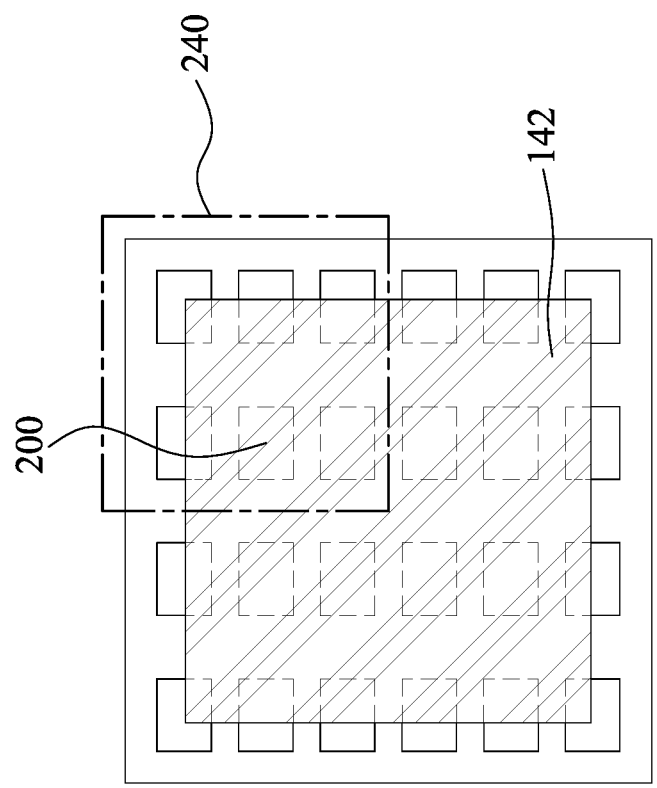

Referring to FIG. 11D and FIG. 11E, FIG. 11D and FIG. 11E illustrate top views of the reinforcement component 142 and unit portions 240. As shown in FIGS. 11D and 11E, each of unit portions 240 may include a plurality of electronic components 200. One reinforcement component 142 may cover multiple unit portions 240, wherein each of the unit portions 240 may correspond to one of the semiconductor package structure 100a-100g. The reinforcement component 142 may cover the regions between two adjacent unit portions 240. Further, as shown in FIGS. 11D and 11E, the reinforcement components 142 may have different surface areas to cover the unit portions 240 of different amount, respectively.

Figure 12:
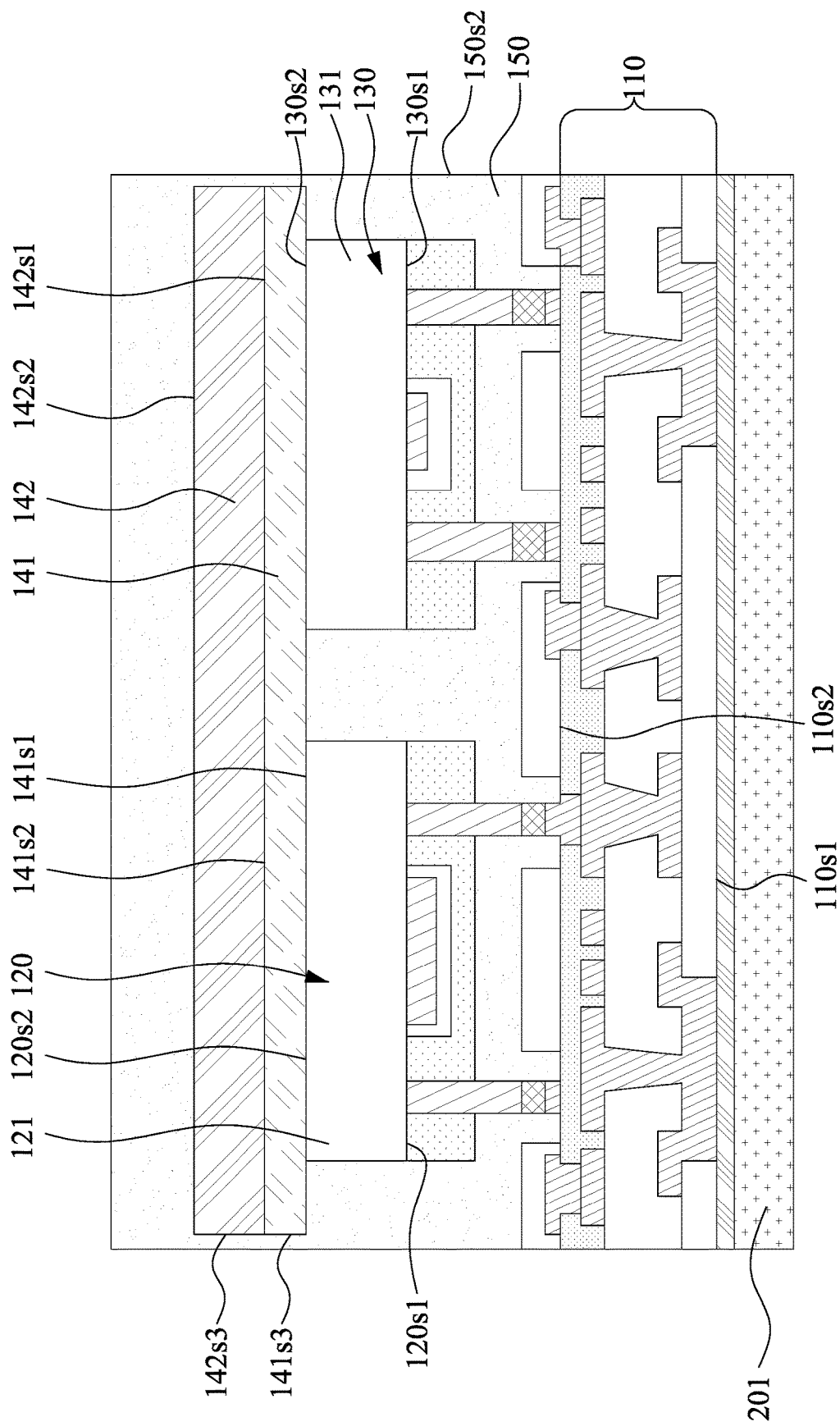

Referring to FIG. 12, an encapsulant 150 may be formed to encapsulate the electronic component 120, the electronic component 130, the buffer layer 141 and the reinforcement component 142. In this stage, the encapsulant 150 may have a first volume. The sum of the electronic component 120, the electronic component 130, and the reinforcement component 142 may have a second volume. In some embodiments, the second volume may be greater than or substantially equal to the first volume. In some embodiments, a ratio between the first volume and the second volume may range from about 3:7 to about 1:1. When the second volume is greater than or substantially equal to the first volume, the warpage may be reduced and prevent the semiconductor package structure from breaking.

In this stage, the encapsulant 150 may have a thickness of at least 250 μm due to the limitation of molds. As the electronic components 120 and 130 are scaled down, the volume ratio of the encapsulant 150 may have a volume more than 60% in this stage, which may cause pronounced warpage of the entire structure, causing, when removing the supporter 201, the structure to break. In this embodiment, the reinforcement component 142 may reduce the volume ratio of the encapsulant 150. Since the reinforcement component 142 has a stiffness greater than that of the encapsulant 150, the whole structure becomes relatively rigid. Therefore, warpage in this stage may be reduced, which may assist in performing subsequent operations, such as removing the supporter 201.

Figure 13:
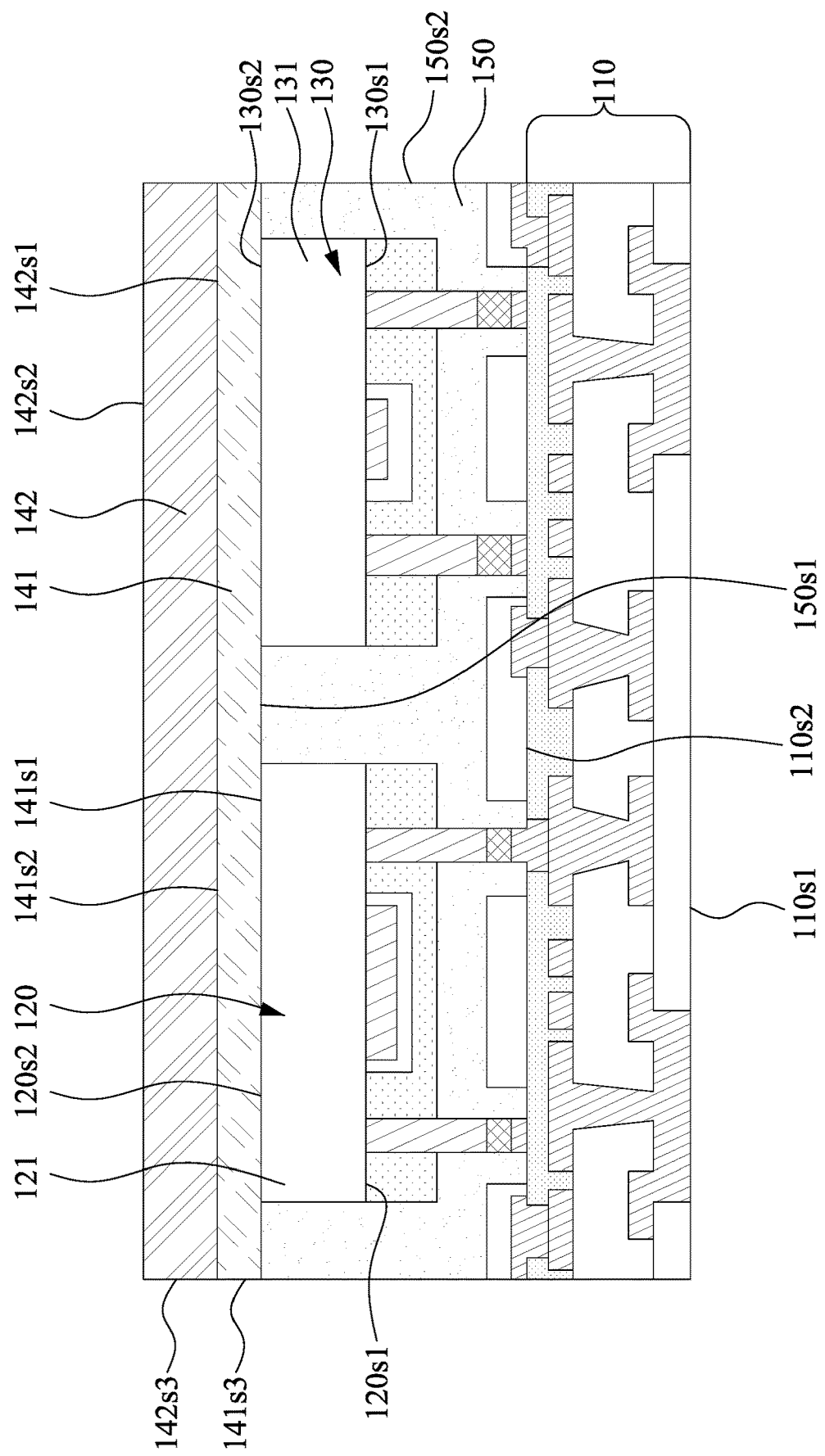

Referring to FIG. 13, the supporter 201 may be removed, and conductive terminals may be formed on the surface 110s1 of the carrier 110. In some embodiments, a sawing operation may be performed to cut the carrier 110, the buffer layer 141, the reinforcement component 142, and the encapsulant 150 to divide the semiconductor package units, such as the semiconductor package units 240a and 240b as shown in FIG. 11B and FIG. 11C or divide the unit portions 240 as shown in FIG. 11D and FIG. 11E. In this stage, a conductive layer of the carrier 110 may be exposed by a lateral surface of the carrier 110. In some embodiments, a grinding operation may be performed prior to the sawing operation. As a result, the surface 150s1 of the encapsulant 150 may be substantially coplanar with the surface 141s1 of the buffer layer 141.

Figure 14:
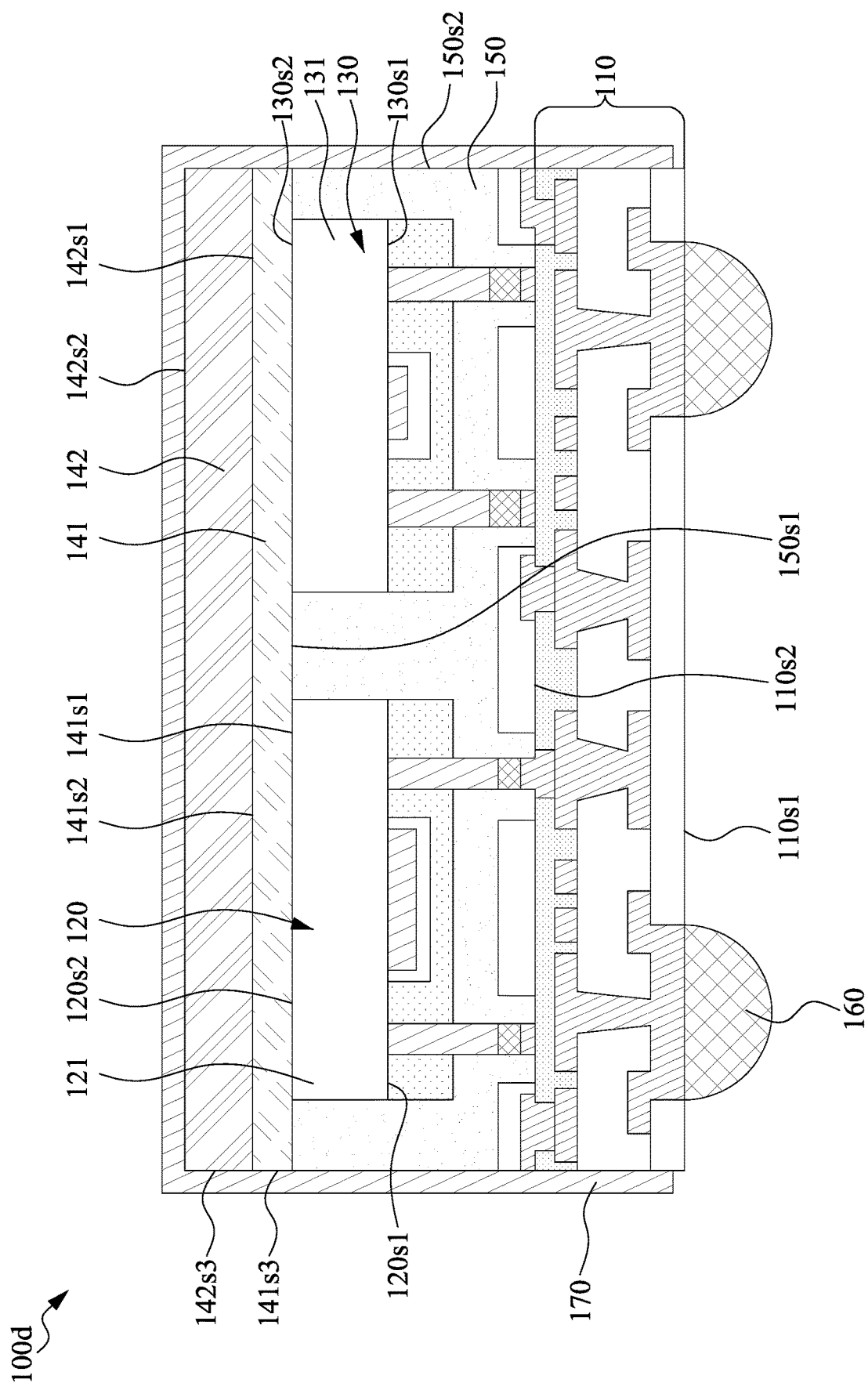

Referring to FIG. 14, a shielding layer 170 may be formed such that a semiconductor package structure similar to the semiconductor package structure 100d of FIG. 5 may be produced.

Figure 15:
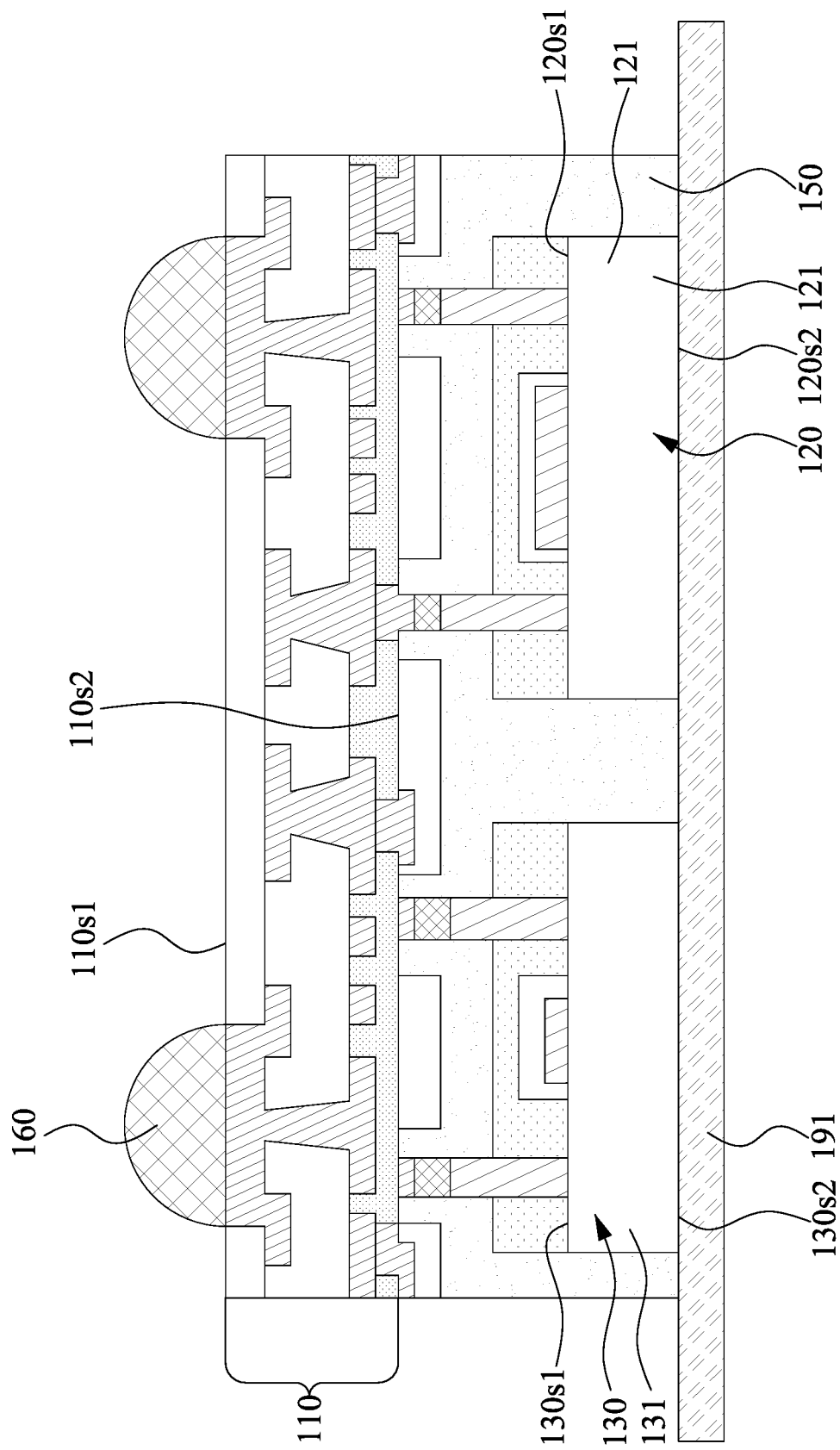
FIG. 15 and FIG. 16 illustrate various stages of an example of a method for manufacturing a semiconductor package structure according to some embodiments of the present disclosure.
Figure 16:
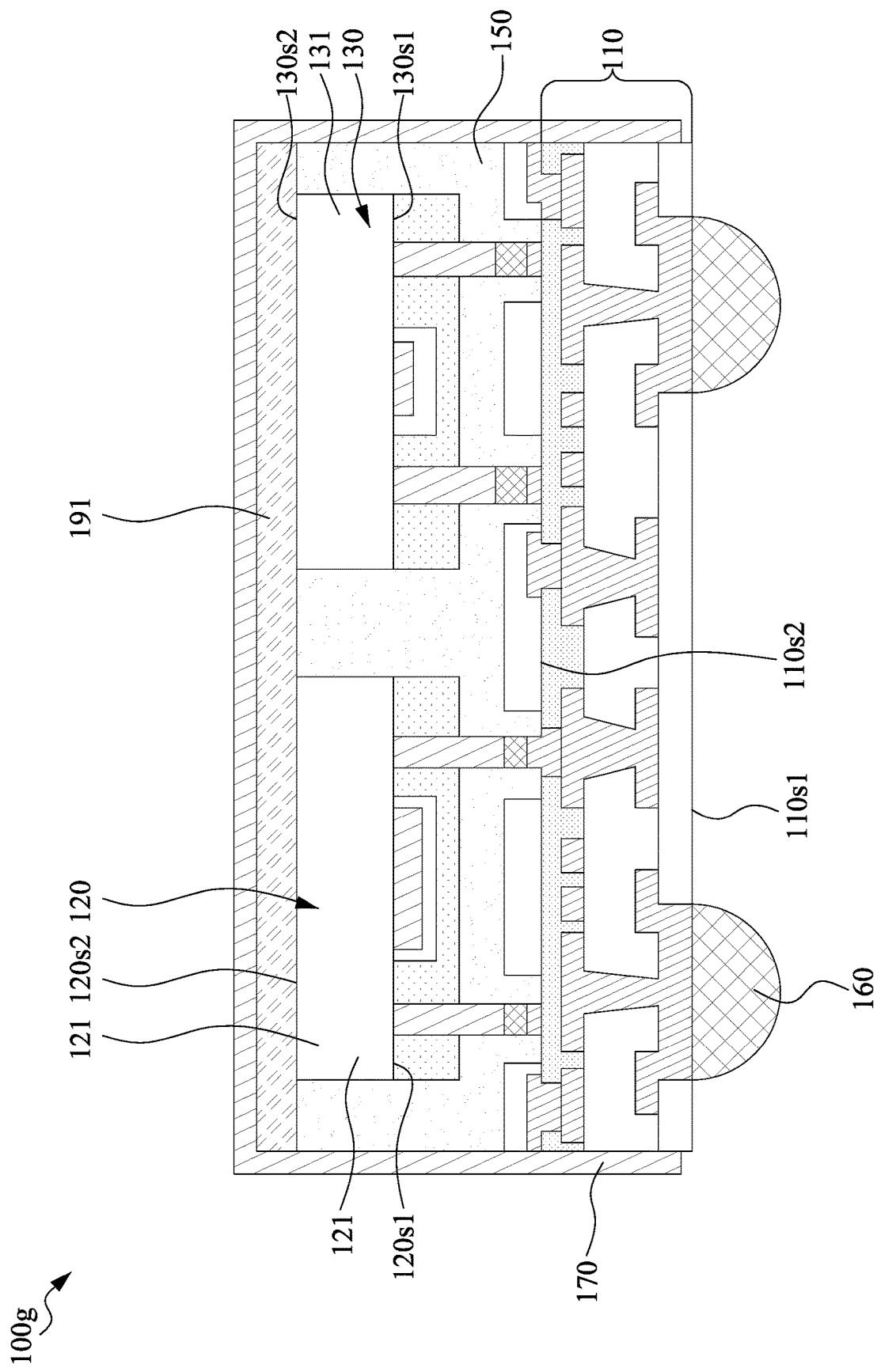

FIG. 15 and FIG. 16 illustrate various stages of an example of a method for manufacturing a semiconductor package structure according to some embodiments of the present disclosure. The initial stage of the illustrated process is the same as, or similar to, the stage illustrated in FIG. 9 through FIG. 13. FIG. 15 depict a stage subsequent to that depicted in FIG. 13.

Referring to FIG. 15, the buffer layer 141 and the reinforcement component 142 may be removed. In some embodiments, a backside film 191 may be formed on the surface 120s2 of the electronic component 120 and the surface 130s2 of the electronic component 120. In some embodiments, a sawing operation may be performed to cut the carrier 110, the buffer layer 141, the reinforcement component 142, and the encapsulant 150 after the backside film 191 is formed. In some embodiments, a grinding operation may be performed on the encapsulant 150 before the backside film 191 is formed.

Referring to FIG. 16, a backside film 191 may be sawed and a shielding layer 170 may be formed such that a semiconductor package structure similar to the semiconductor package structure 100g of FIG. 8 may be produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first electronic component having a first top surface;
   a second electronic component having a second top surface; and
   a reinforcement component disposed over the first electronic component and the second electronic component and having a bottom surface;
   a shield layer in contact with a top surface of the reinforcement component and spaced apart from a side surface of the reinforcement component,
   wherein a distance between the bottom surface of the reinforcement component and the first top surface of the first electronic component is different from a distance between the bottom surface of the reinforcement component and the second top surface of the second electronic component.

2. The semiconductor package structure of claim 1, wherein a portion of the second top surface of the second electronic component is exposed from the reinforcement component.

3. The semiconductor package structure of claim 1, further comprising:
   a substrate supporting the first electronic component and the second electronic component, wherein the substrate has a first edge and a second edge, the reinforcement component has a first side and a second side, the first side of the reinforcement component is aligned with the first edge of the substrate, and the second side of the reinforcement component is misaligned with the second edge of the substrate.

4. The semiconductor package structure of claim 3, wherein the first side is opposite to the second side of the reinforcement component.

5. The semiconductor package structure of claim 1, further comprising:
an encapsulant covering the first electronic component and the second electronic component, wherein the encapsulant has a first edge and a second edge, and the reinforcement component has a first side aligned with the first edge of the encapsulant and a second side misaligned with the second edge of the encapsulant.

6. A semiconductor package structure, comprising:
a substrate including a surface;
a first electronic component disposed over the surface and having a top surface with a first elevation;
a second electronic component disposed over the surface and having a top surface with a second elevation different from the first elevation;
a buffer layer covering the top surface of the first electronic component and the top surface of the second electronic component, wherein the buffer layer has a top surface which is substantially planar, wherein a first portion of the buffer layer is disposed at a side of the first electronic component and spaced apart from the first electronic component.

7. The semiconductor package structure of claim 6, wherein the buffer layer has a first thickness over the top surface of the first electronic component and a second thickness over the top surface of the second electronic component, and the first thickness is different from the second thickness.

8. The semiconductor package structure of claim 6, wherein the top surface of the buffer layer is more planar than a bottom surface of the buffer layer.

9. The semiconductor package structure of claim 6, wherein the buffer layer has a portion tapered toward the substrate.

10. The semiconductor package structure of claim 6, wherein the buffer layer covers a lateral surface of the second electronic component, and a lateral surface of the first electronic component is free from overlapping by the buffer layer.

11. The semiconductor package structure of claim 6, wherein the substrate has a first edge and a second edge different from the first edge, the buffer layer has a first side and a second side different from the first side, the first side of the buffer layer is aligned with the first edge of the substrate, and the second side of the buffer layer is misaligned with the second edge of the substrate.

12. A method of manufacturing a semiconductor package structure, comprising:
providing a semiconductor substrate including a plurality of unit portions, each of the plurality of unit portions carrying a plurality of electronic components; and
disposing a reinforcement component on at least one of the plurality of unit portions and covering at least one of the plurality of electronic components; and
dividing the semiconductor substrate to separate the plurality of unit portions from each other, wherein one of the plurality of electronic components is closest to an edge of a respective unit portion of the plurality of unit portions, and the one of the plurality of electronic components is exposed from the reinforcement component from a top view.

13. The method of claim 12, wherein an edge of one of the plurality of unit portions is exposed from the reinforcement component from the top view.

14. The method of claim 12, further comprising:
dividing the reinforcement component.

15. The method of claim 12, further comprising:
forming an encapsulant covering the plurality of electronic components and a side surface of the reinforcement component; and
dividing the encapsulant.

16. The semiconductor package structure of claim 12, wherein a second portion of the buffer layer is disposed between the first electronic component and the second electronic component, and there is a gap between the buffer layer and at least one of the first electronic component and the second electronic component.

* * * * *